United States Patent [19]
Williams

[11] Patent Number: 4,947,363
[45] Date of Patent: Aug. 7, 1990

[54] PIPELINED PROCESSOR FOR IMPLEMENTING THE LEAST-MEAN-SQUARES ALGORITHM

[75] Inventor: Tim A. Williams, Austin, Tex.

[73] Assignee: Motorola, Inc., Schaumburg, Ill.

[21] Appl. No.: 283,101

[22] Filed: Dec. 12, 1988

[51] Int. Cl.$^5$ ............................................. G06F 15/31
[52] U.S. Cl. ............................................. 364/724.19
[58] Field of Search ............ 364/724.01, 724.13, 364/724.19, 728.01, 728.02, 724.10

[56] References Cited

U.S. PATENT DOCUMENTS

| | | | |
|---|---|---|---|
| 4,321,686 | 3/1982 | Horna | 364/724.19 |
| 4,754,419 | 6/1988 | Iwata | 364/724.19 |
| 4,802,111 | 1/1989 | Barkan et al. | 364/724.1 |
| 4,829,463 | 5/1989 | Kakishita et al. | 364/724.19 |

OTHER PUBLICATIONS

P. Feintuch, "An Adaptive Recursive LMS Filter", Proceedings of the IEEE, Nov. 1976, pp. 1622–1624, vol. 64, No. 11.

P. Thompson, "A Constrained Recursive Adaptive Filter for Enhancement of Narrowband Signals in White Noise", Conference Regard to the 12th Asilomar Conference on Circuits, Systems and Computers, Nov. 1978, pp. 214–218.

Primary Examiner—Gary V. Harkcom
Assistant Examiner—Long T. Nguyen
Attorney, Agent, or Firm—Robert L. King

[57] ABSTRACT

A filter processor implements the least mean squares (LMS) algorithm in an N tap digital filter in (N+1) time cycles, where N is an integer. A filter structure is shown which is implemented with a processor having an update portion and a convolution portion. A single memory is shared between the two portions, and the same data is concurrently coupled to both portions for concurrent use. The filter may be efficiently pipelined wherein successive adaptive and convolution operations are executed to efficiently implement an N tap filter with a minimum amount of circuitry.

8 Claims, 5 Drawing Sheets

| CLOCK CYCLE | PHASE | OPERATION | RAM 99 READ | RAM 99 WRITE | RECODER 92 | MULTIPLIER 87 INPUT 1 | ADDER 96 INPUT 1 | ADDER 96 INPUT 2 | RECODER 93 | MULTIPLIER 106 INPUT 1 | ADDER 110 INPUT 1 | ADDER 110 INPUT 2 | C1 | C2 | C3 | C4 | C5 |
|---|---|---|---|---|---|---|---|---|---|---|---|---|---|---|---|---|---|
| 1 | φ1 | ADDER 96 -> NO OPERATION | X(3,K) | | | | | | | | | | | | | | 0 |
| 1 | φ2 | ADDER 110 -> Y(K-1)=Y(K-1)+T(0,K-1)  MULTIPLIER 87 -> C(2,K)=X(3,K)*βe(K-1)  MULTIPLIER 106 -> NO OPERATION | W(2,K-1) | | X(3,K) | βe(K-1) | | | | | ACCU- MULATE | T(0,K-1) | RAM | ADDRESS A | READ | | 0 |
| 2 | φ1 | ADDER 96 -> W(2,K)=C(2,K)+W(2,K-1)  ADDER 110 -> NO OPERATION | X(2,K)  W(1,K-1) | | X(2,K) | βe(K-1) | W(2,K-1) | C(2,K) | | | | | RAM | ADDRESS A | READ | e(K-1) | 1 |
| 2 | φ2 | MULTIPLIER 87 -> C(1,K)=X(2,K)*βe(K-1)  MULTIPLIER 106 -> T(2,K)=W(2,K)*X(2,K) | | X(3,K+1)  W(2,K) | | | | | X(2,K) | W(2,K) | | | | ADDRESS B | WRITE | | 0 |

PIPELINED PROCESSOR FOR IMPLEMENTING THE LEAST-MEAN-SQUARES ALGORITHM

CROSS REFERENCE TO RELATED APPLICATION

U.S. patent application Ser. No. 07/468,481 entitled "A Data Processor With Combined Adaptive LMS and General Multiplication Functions" filed by Tim Williams et al. and assigned to the assignee hereof.

FIELD OF THE INVENTION

This invention relates generally to data processors, and more particularly, to adaptive filter data processors.

BACKGROUND OF THE INVENTION

Broadly stated, transfer functions represent either linear, time invariant systems or time varying, adaptive systems. For a linear time invariant system, a predetermined impulse function is used for excitation and an impulse response results. Given any other input waveform, the impulse response can be utilized by convolving the impulse response with the input waveform to determine the output. In contrast, in an adaptive system the impulse function is changing at every data sample point or set of data samples. Therefore, the adaptive system is time varying or nonlinear. A digital filter is directed to a particular transfer function by an adaption process depending upon the desired function of the filter. One application of a digital filter is to achieve the minimum mean square error when filtering a set of data with a predetermined transfer function. This function is known as the least-mean-squares (LMS) algorithm. The error represents an error between some desired goal and what the filter is actually outputting and is a measurement of the misadjustment of the filter. The LMS algorithm involves: (1) an adaption computation which is an update of coefficients in the filter based in part upon the previous error; (2) a convolution computation which is an accumulation of the product of predetermined coefficient values and data values; (3) and an error calculation. The error calculation is a subtraction of the outputted value of the convolution computation from predetermined desired value.

An example of a commercially available adaptive filter processor is the Fujitsu MB87XXAFP which is capable of supporting the LMS adaptive FIR filter algorithm. In known LMS algorithm systems, the convolution calculation is initially performed from which the error is determined. Then the update calculation, in which the error is utilized, is performed. For very high multiple tap filters this means that the convolution computation for all the taps must be initially computed, and then the error and update calculations for all the taps must be performed. Disadvantages with the known LMS algorithm implementations include the large number of processor clock cycles required to implement a multiple tap filter, the use of multiple memory structures to store coefficient, data and error values, and inefficiency in pipelining multiple, disjoint filters. Typically, previous systems which have implemented multiple filter functions in a pipelined fashion have used individual integrated circuit products which operate in a cascaded structure.

BRIEF DESCRIPTION OF THE INVENTION

Accordingly, it is an object of the present invention to provide an improved pipelined processor for implementing the least-mean-squares (LMS) algorithm.

It is another object of the present invention to provide an improved digital filter structure for implementing an adaptive filter.

It is yet another object of the present invention to provide an improved method for implementing the least-mean-squares (LMS) algorithm.

In carrying out these and other objects of the invention, there is provided, in one form, a method and pipelined processor for implementing a least mean squares (LMS) algorithm in an N-tap filter where N is an integer. The convolution of a series of data values and coefficient values are calculated for the N taps. Substantially concurrently, the processor performs an adaption calculation of the series of coefficient values by updating the coefficient value for each tap of the filter. An update portion of the pipelined processor performs a predetermined number of update calculations during a predetermined time period. A convolution portion is coupled to the update portion for performing a predetermined number of convolution products during the same time period. A storage portion is coupled to both the update portion and the convolution portion for selectively providing the data values and coefficient value required by both the update portion and convolution portion to implement the least means squares algorithm.

These and other objects, features and advantages will be more clearly understood from the following detailed description taken in conjunction with the accompanying drawings.

BRIEF DESCRIPTION OF THE DRAWINGS

FIGS. 6A & 6B illustrate in graphical chart form the pipelined operation of the processor of the present invention.

DETAILED DESCRIPTION OF THE INVENTION

Generally, the LMS algorithm is comprised of two interdependent equations. One of the two equations is typically referred to as an update equation and the other equation is referred to as a convolution equation. The update equation is the adaptive portion of a digital filter and corrects the filter coefficients in a manner similar to the conventional Newton-Ralphson iteration algorithm. The convolution equation is a conventional FIR filter equation. Both equations are performed on each tap of a filter at each data sample period.

Figure 1:
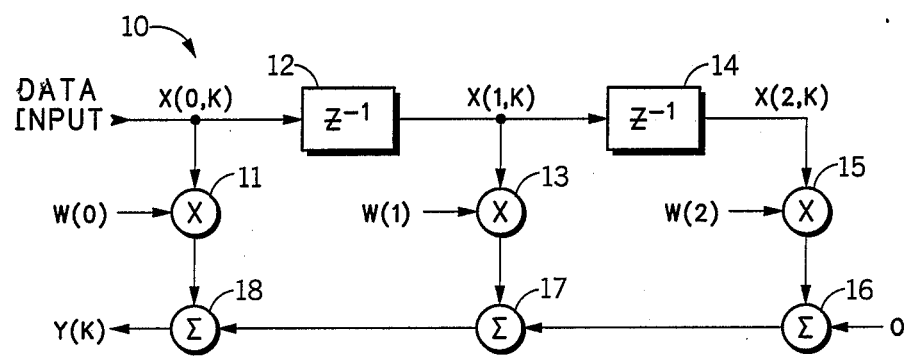
FIG. 1 illustrates in block diagram form a known filter structure for implementing the convolution equation for the LMS algorithm.

Shown in FIG. 1 is a time invariant filter structure 10 for implementing the convolution required by the LMS algorithm. The convolution may be expressed by the following equation:

$$Y(k) = \sum_{j=0}^{N-1} X(j,k) * W(j,k) \quad \text{for } k = 0, 1, 2, \ldots \infty \quad (1)$$

where "j" represents a tap number value, "k" represents time and "N" is the number of taps in the filter. An input terminal of filter structure 10 receives a data input labeled "X(0,k)" which represents a data value "X" at tap zero and time k. The data input value is connected to a first terminal of a multiplier 11 and to an input of a delay circuit 12 having a delay function represented as "$Z^{-1}$" in the Z domain. A coefficient value labeled "W(0)" is connected to a second input of multiplier 11. An output of delay circuit 12 provides data input "X(1,k)" which represents the data value "X" at tap one and time k. The output of delay circuit 12 is connected to a first input of multiplier 13 and to an input of a delay circuit 14. A coefficient value labeled "W(1)" is connected to a second input of multiplier 13. An output of delay circuit 14 provides data input "X(2,k)" which represents the data value "X" at a tap two and time k. The output of delay circuit 14 is connected to a first input of a multiplier 15. A second input of multiplier 15 receives a coefficient value labeled "W(2)". An output of multiplier 15 is connected to a first input of an adder circuit 16. A second input of adder circuit 16 receives a binary zero value. An output of adder circuit 16 is connected to a first input of an adder circuit 17. An output of multiplier 13 is connected to a second input of adder circuit 17. An output of adder circuit 17 is connected to a first input of an adder circuit 18. An output of multiplier 11 is connected to a second input of adder circuit 18. An output of adder circuit 18 provides the convolution output signal Y(k) as defined by equation (1).

In operation, adder circuits 16, 17 and 18 receive individual products representing products of predetermined coefficient values and tap data values. Adder circuits 16, 17 and 18 sum the products to provide an accumulated output signal Y(k) at time k as defined in equation one. Initially, the data input at tap two is multiplied by "W(2)" and summed with zero. Then the same time interval k, the first product is summed with the product of the data input at tap one multiplied by "W(1)". The resulting sum of adder circuit 17 is added with the product resulting from the output data of tap zero multiplied by "W(0)" to provide Y(k). The coefficient values W(0), W(1) and W(2) are fixed, nonvarying coefficients which is why the impulse response is time invariant.

Figure 2:
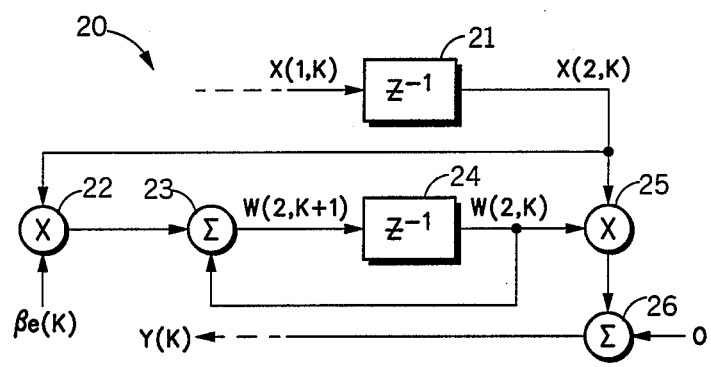
FIG. 2 illustrates in block diagram form another known filter structure for implementing the adaption rule and convolution for the LMS algorithm.

Shown in FIG. 2 is a known filter structure 20 which represents a single filter tap of an adaptive or time varying filter in which both an adaption calculation and a convolution operation, as expressed in equation one, are performed. In other words, coefficient values W(0), W(1) and W(2) of FIG. 1 are formed in each time period and are time varying. The adaption calculation for the LMS algorithm may be expressed as:

$$W(j,k) = W(j,k-1) + \beta * e(k-1) * X(j,k-1) \quad (2)$$

where:
j = 0, ... N−1 and
k = 0, 1, 2 ... ∞.

A delay circuit 21 has an input for receiving a data input X(1,k). An output of delay circuit 21 provides a data input X(2,k) and is connected to both a first input of a multiplier 22 and a first input of a multiplier 25. A second input of multiplier 22 is connected to an error signal $\beta e(k)$. The term $\beta$ is a predetermined constant value which is chosen depending upon the filter application. An output of multiplier 22 is connected to a first input of an adder 23. An output of adder 23 is connected to an input of a delay circuit 24. An output of delay circuit 24 is connected to both a second input of adder circuit 23 and a second input of a multiplier 25. Delay circuit 24 provides an updated coefficient value W(2,k). An output of multiplier 25 is connected to a first input of an adder circuit 26. A second input of adder circuit 26 receives a binary zero input. An output of adder circuit 26 provides the first accumulation of signal Y(k) in the convolution algorithm of equation one.

In operation, data input X(1,k) is received by delay circuit 21 from tap location one. Delay circuit 21 provides data input X(2,k) which is connected to both multiplier 22 and multiplier 25. Multiplier 25 receives the coefficient value W(2,k) simultaneously and provides an initial convolution product at the output of multiplier 25 in accordance with equation one. Simultaneously, the coefficient value W(2,k) is summed with the product of [X(2,k)*$\beta e(k)$] to provide an updated coefficient value W(2,k+1) for subsequent use by multiplier circuit 25. In this manner, the coefficient value for tap location two is constantly modified as a function of the tap value provided by delay circuit 21 and the error term $\beta e(k)$. Since a structure such as filter structure 20 is required for each tap, the amount of circuitry required for a multi-tap filter is very large.

Figure 3:
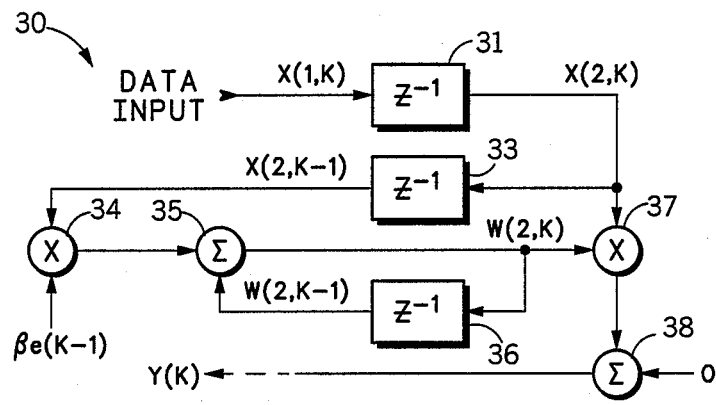
FIG. 3 illustrates in block diagram form yet another known filter structure for implementing the adaption rule and convolution for the LMS algorithm.

Shown in FIG. 3 is a filter structure 30 which is a modification of structure 20 of FIG. 2. In structure 30, a data input X(1,k) is connected to an input of a delay circuit 31. An output of delay circuit 31 provides a data input X(2,k) which is connected to both an input of a delay circuit 33 and to a first input of a multiplier 37. An output of delay circuit 33 provides a delayed data input X(2,k−1) and is connected to a first input of a multiplier 34. A second input of multiplier 34 receives an error term $\beta e(K-1)$. An output of multiplier 34 is connected to a first input of an adder circuit 35. An output of adder circuit 35 provides a coefficient value W(2,K) and is connected to both an input of delay circuit 36 and to a second input of multiplier 37. An output of delay circuit 36 provides a coefficient value W(2,K−1) and is connected to a second input of adder circuit 35. An output of multiplier 37 is connected to a first input of an adder circuit 38. A second input of adder circuit 38 is connected to a logic zero value. An output of adder circuit 38 provides the first accumulation of signal Y(K) in implementing the convolution algorithm of equation (1).

In operation, filter structure 30 structurally differs significantly from filter structure 20 by relocating the placement of delay circuit 24 of FIG. 2 but is functionally equivalent. By relocating the function of delay circuit 24 of FIG. 2 before adder 23, the same function can be accomplished. Therefore, in FIG. 3, the delay function which was implemented by delay circuit 24 of FIG. 2 is accomplished by delay circuits 33 and 36 and by coupling the error term $\beta e(K-1)$ to multiplier 34. As with filter structure 20, filter structure 30 implements the LMS algorithm by performing both the adaption rule of equation one and the convolution algorithm of equation two.

Figure 4:
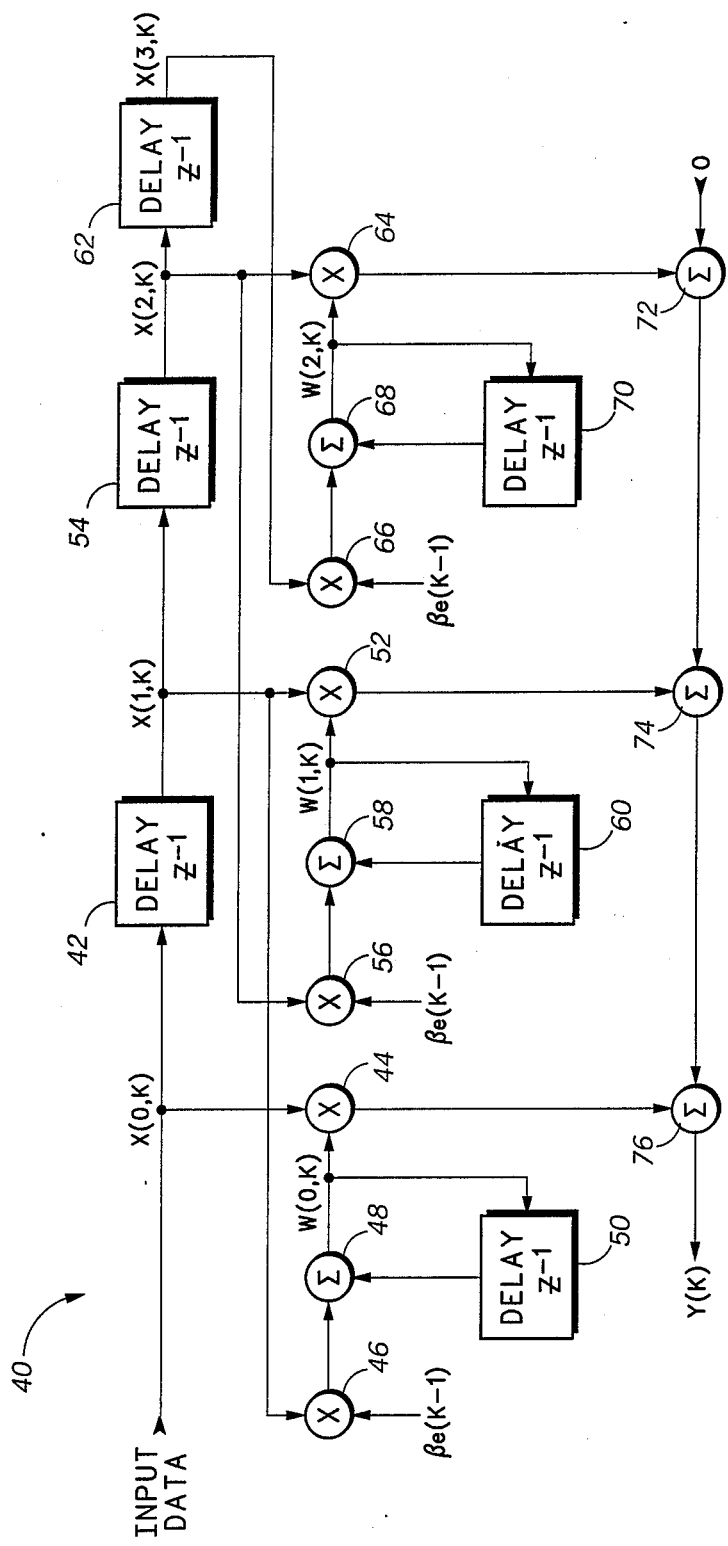
FIG. 4 illustrates in block diagram form a filter structure for implementing the adaption rule of the LMS algorithm in accordance with the present invention.

Shown in FIG. 4 is a filter structure 40 which is an extension of filter structure 30 and which is a three tap filter for implementing the LMS algorithm. It should be well understood that the present invention may be utilized to implement any number of filter taps and that the embodiment of only three taps in FIG. 4 is by way of illustration only rather than limitation. A data input X(0,k) is connected to an input of a delay circuit 42 and to a first input of a multiplier 44. An output of delay circuit 42 provides a delayed input data X(1,k) and is connected to a first input of a multiplier 46. A second input of multiplier 46 is connected to an error term $\beta e(K-1)$. An output of multiplier 46 is connected to a first input of an adder circuit 48. An output of adder circuit 48 provides an update coefficient value W(0,k) and is connected to both a second input of multiplier 44 and to an input of a delay circuit 50. An output of delay circuit 50 is connected to a second input of adder circuit 48. The output of delay circuit 42 is also connected to both a first input of a multiplier 52 and to an input of a delay circuit 54. An output of delay circuit 54 provides a delayed data input X(2,k) and is connected to a first input of a multiplier 56. A second input of multiplier 56 is connected to the error term $\beta e(K-1)$. An output of multiplier 56 is connected to a first input of an adder circuit 58. An output of adder circuit 58 provides an update coefficient value W(1,k) and is connected to both a second input of multiplier 52 and to an input of a delay circuit 60. An output of delay circuit 60 is connected to a second input of adder circuit 58. The output of delay circuit 54 is also connected to both a first input of a multiplier 64 and to an input of a delay circuit 62. An output of delay circuit 62 provides a delayed data input X(3,k) and is connected to a first input of a multiplier 66. A second input of multiplier 66 is connected to the error term $\beta e(K-1)$. An output of multiplier 66 is connected to a first input of an adder circuit 68. An output of adder circuit 68 provides an update coefficient value W(2,k) and is connected to both a second input of multiplier 64 and to an input of a delay circuit 70. An output of delay circuit 70 is connected to a second input of adder circuit 68. An output of delay circuit 70 is connected to a second input of adder circuit 68. An output of multiplier 64 is connected to a first input of an adder circuit 72. A second input of adder circuit 72 is connected to a binary zero value. An output of adder circuit 72 is connected to a first input of an adder circuit 74. An output of multiplier 52 is connected to a second input of adder circuit 74. An output of adder circuit 74 is connected to a first input of an adder circuit 76. An output of multiplier 44 is connected to a second input of adder circuit 76. An output of adder circuit 76 provides the convolution output signal Y(k) of the LMS algorithm.

In operation, each tap computation in the time varying LMS filter structure 40 requires an update computation (equation two) and a convolutional computation (equation one). To perform these two computations requires two multiply/add operations per filter tap for each new data sample. Filter structure 40 allows pipelining of the operations of multiplication and addition as well as the update and convolutional computations. Each adder and each multiplier may be allowed to have an entire half cycle to form its respective computation. As the tap data inputs X and coefficient values W indicate, all the operations at each tap location are occurring substantially simultaneously during a single time cycle such as cycle k. For example, at tap location three, multipliers 64 and 66 are functioning during a first half of time cycle k. During a second half of time cycle k, adders 68 and 72 are functioning. Similarly, multipliers 52 and 56 of tap location two and multipliers 44 and 46 of tap location one are also functioning during the first half of time cycle k. Adders 58 and 74 of tap location two and adders 48 and 76 of tap location one are also functioning during the second half of time cycle k.

During the first half of time cycle k, multiplier 64 is multiplying W(2,k) and X(2,k) to implement a product portion of the convolutional algorithm of equation one. Simultaneously, multiplier 66 is forming the product of X(3,k) and $\beta e(k-1)$ which is a portion of the adaption algorithm of equation two. It should be noted that the data input X(3,k) is equivalent to X(2,k-1) where (k-1) is the time cycle prior to time cycle k. Therefore, an updated coefficient value W for time cycle k is formed in time cycle k with data and error information from the previous time cycle (k-1).

During the second half of time cycle k, adder 72 is adding the previously formed product of W(2,k) and X(2,k) with a forced binary zero. Successively and sequentially adders 74 and 76 complete the total accumulation for successive taps to complete implementation of the convolution algorithm of equation one. Simultaneously during the second half of time cycle k, adder 68 is adding the previous coefficient value W(2,k) provided by delay circuit 70 with the product provided by multiplier 66 to provide an updated coefficient value W(2,k+1) for the next time cycle (k+1). While each of the computations for each tap location may occur substantially simultaneously, it should be noted that the computations may be sequentially pipelined and computed from the highest tap location at the right to the lowest tap location at the left.

In the illustrated form, it should be noted that each tap filter structure of the three taps shown in FIG. 4 differs from the individual tap structure of FIG. 3. In particular, the delay circuit 33 in filter structure 30 of FIG. 3 has been eliminated in each filter tap location of filter structure 40 of FIG. 4. For example, at filter tap location 0 in filter structure 40, this delay function is provided by delay circuit 42. At filter tap location 1 the delay function is provided by delay circuit 54, and at filter tap location 2 the delay function is provided by delay circuit 62. In addition to minimizing the number of delay circuits required to implement a multiple tap filter, filter structure 40 also provides the advantage of being able to use a single data value to simultaneously drive or recode both multipliers 46 and 52 from the output of delay circuit 42 and to drive or recode both multipliers 56 and 64 from the output of delay circuit 54. As will be shown below, the simultaneous recoding ability of two multipliers provides speed, size and pipelining advantages.

Figure 5:
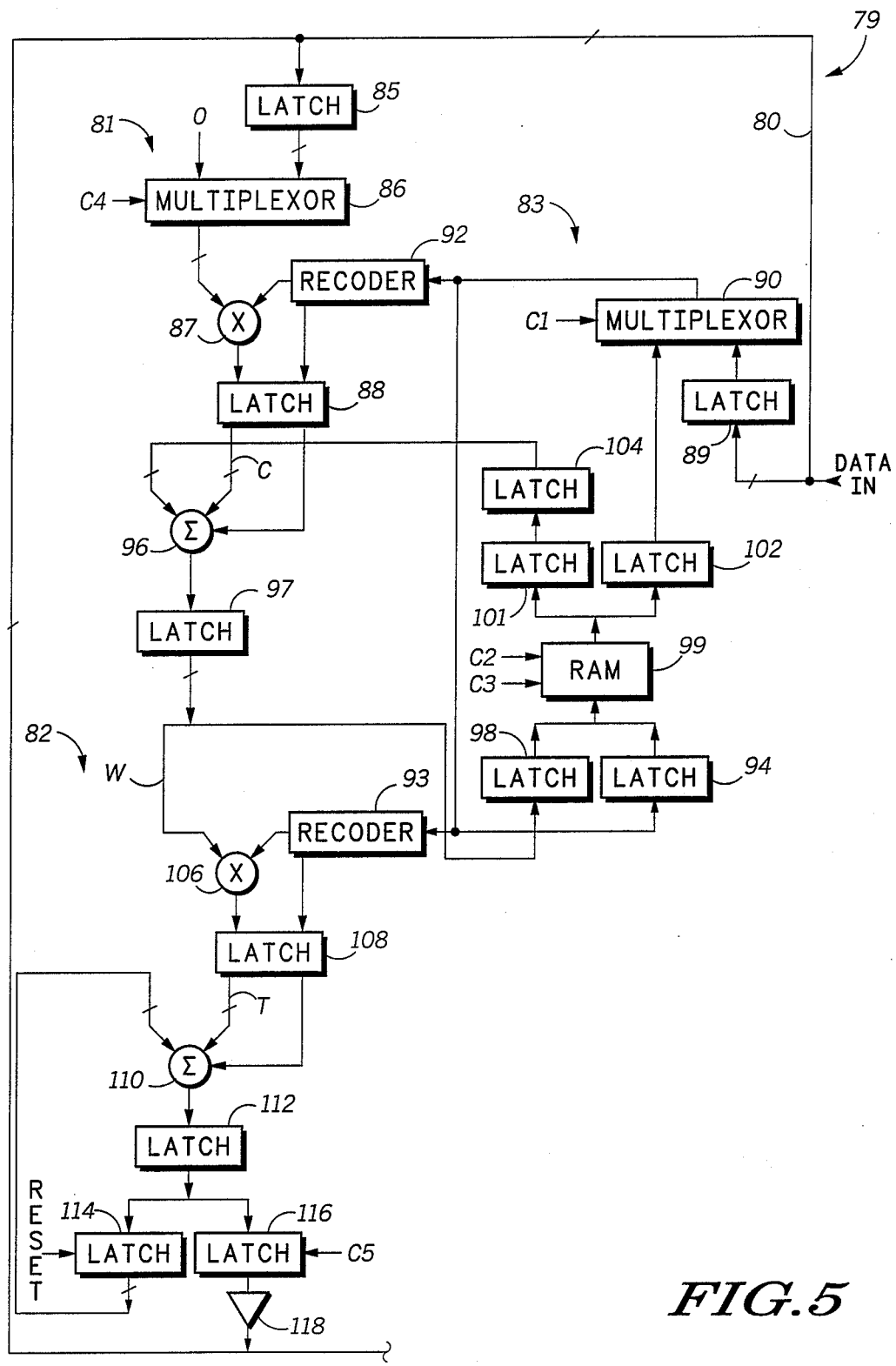
FIG. 5 illustrates in block diagram form a pipelined processor which implements the filter structure of FIG. 4 in accordance with the present invention.

Shown in FIG. 5 is a pipelined processor 79 which implements filter structure 40 of FIG. 4 for a predetermined integer number N of taps. In particular, processor 79 functions to implement the LMS algorithm. Processor 79 communicates with a bidirectional data bus 80. Generally, processor 79 may be considered as having an update portion 81 for providing time varying coefficient values, a convolution portion 82 and a control portion 83. An input of a latch 85 is connected to data bus 80. An output of latch 85 is connected to a first input of a multiplexor 86. A control signal C4 is connected to a control input of multiplexor 86. A second input of multiplexor 86 is connected to a binary zero value. An output of multiplexor 86 is connected to a first input of multiplier 87. An output of multiplier 87 is connected to a first input of a latch 88. An input output of multiplier 87 is connected to a first input of a latch 88. An input of a latch 89 is connected to data bus 80. An output of latch 89 is connected to a first input of a multiplexor 90. A control signal labeled "C1" is connected to a control input of multiplexor 90. An output of multiplexor 90 is connected to an input of each of recoder circuits 92 and 93 and to an input of a latch 94. A first output of recoder circuit 92 is connected to a second input of multiplier 87. A second output of recoder circuit 92 is connected to a second input of latch 88. A first output of latch 88 provides a signal labeled "C" and is connected to a first input of an adder 96, and a second output of latch 88 is connected to a control input of adder 96. An output of adder 96 is connected to an input of a latch 97. An output of latch 97 is connected to an input of a latch 98. An output of each of latches 94 and 98 is connected to an input of a random-access-memory (RAM) 99. Control signals "C2" and "C3" are connected to respective control inputs of RAM 99. An output of RAM 99 is connected to an input of both a latch 101 and a latch 102. An output of latch 102 is connected to a second input of multiplexor 90, and an output of latch 101 is connected to an input of a latch 104. An output of latch 104 is connected to second input of adder 96.

In convolution portion 82, a first input of a multiplier 106 is connected to an output of a latch 97 for receiving a signal labeled "W". A first output of recoder 93 is connected to a second input of multiplier 106. An output of multiplier 106 is connected to a first input of a latch 108. A second output of recoder 93 is connected to a second input of latch 108. An output of latch 108 provides a signal labeled "T" and is connected to a first input of an adder 110. A control output of latch 108 for selecting either an addition or subtraction mode of operation of adder 110 is connected to adder 110. An output of adder 110 is connected to an input of latch 112. An output of latch 112 is connected to an input of both latches 114 and 116. An output of latch 114 is connected to a second input of adder 110. A reset signal is connected to a reset terminal of latch 114, and a control signal C5 is connected to a control input of latch 116. An output of latch 116 is connected to an input of a bus driver circuit 118. An output of bus driver circuit 118 is connected to data bus 80.

In operation, processor 79 functions in a pipelined manner to successively perform update and convolution operations. Processor 79 also pipelines the operations of multiplication and addition required to implement the LMS algorithm. Organizing the computations in this manner allows each adder and multiplier to have an entire half cycle to form its result. Also a single RAM structure is utilized to hold both tap weights and filter data. Eliminating the use of independent RAMs for the coefficients and data saves a significant amount of circuit area.

Figure 6B:
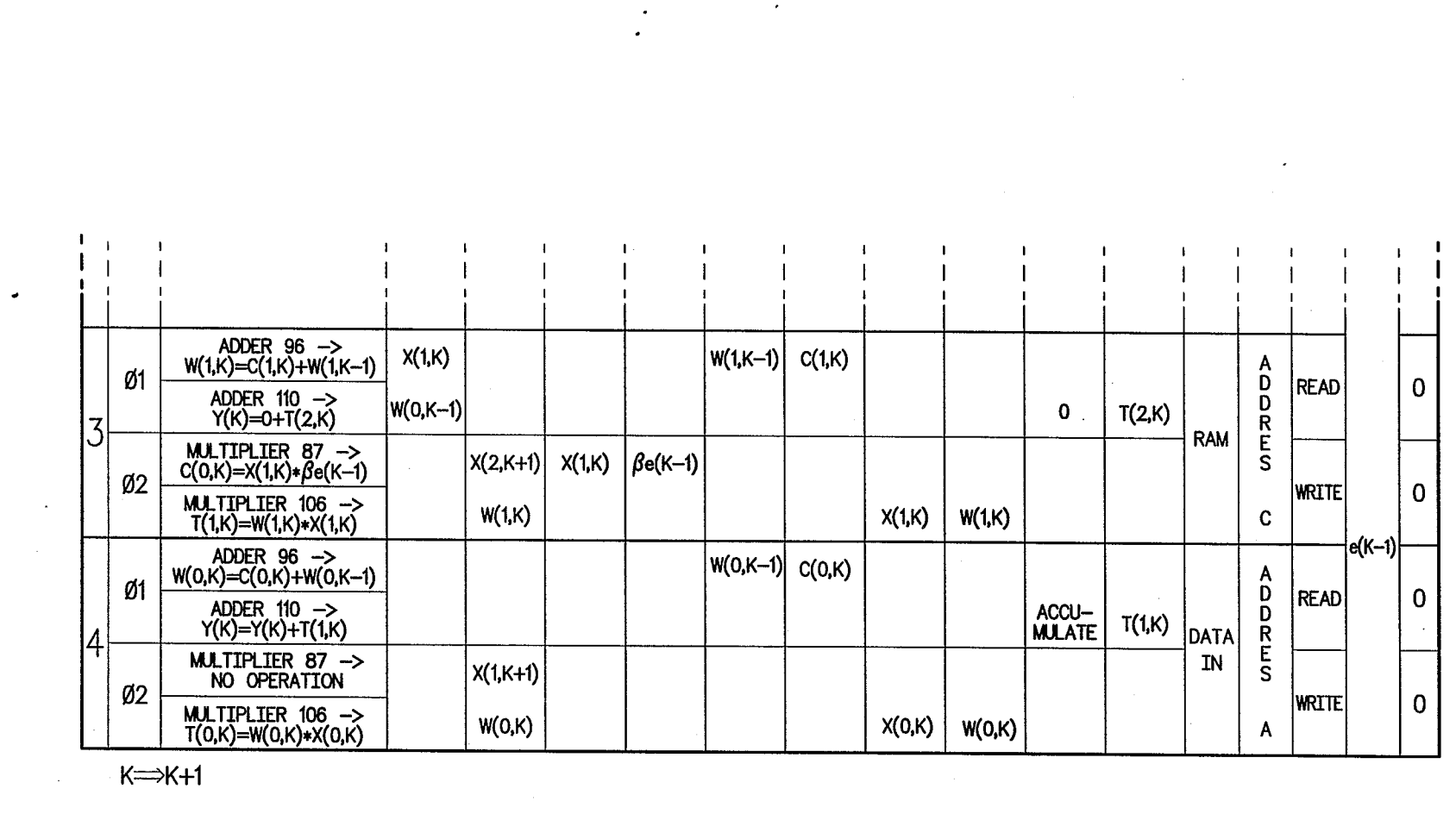

By referring to FIG. 6, the operation of processor 79 can be more readily understood. Shown in FIG. 6 is a timing sequence diagram illustrating the machine operations which occur to provide one convolutional output $Y(k)$. The illustrated steps are then repetitive in order to provide subsequent time varying output signals $Y(k)$. In the illustrated form, a three tap filter such as that in FIG. 4 is described wherein four machine clock cycles are required to provide an output. In general, the present invention implements an N-tap filter in (N+1) clock cycles, where N is an integer. Each clock cycle has two phases, $\phi 1$ and $\phi 2$, which are nonoverlapping clocks having substantially a fifty percent duty cycle. During clock phase $\phi 1$, adder 96 of update portion 81 and adder 110 of convolution portion 82 are operational. During clock phase $\phi 2$, multiplier 87 of update portion 81 and multiplier 106 of convolution portion 82 are operational. In the first clock phase of the first clock cycle, adder 96 is not yet required and is not operational. RAM 99 is read to provide an input data $X(3,k)$ originally received from data bus 80 thru latch 89 and multiplexor 90. Adder 110 functions to provide an updated value for $Y(k)$ from the previous time period $(k-1)$ by adding the current value of $Y(k)$ provided via a feedback path thru latch 114 with the last multiplier output value $T(0,k-1)$ provided by multiplier 106 during time period $(k-1)$. At the very beginning of operation, this value is zero. Concurrently, the coefficient value $W(2,k-1)$ is read from RAM 99 for subsequent use in clock cycle two at the first input of adder 96. The reason the coefficient value $W(2,k-1)$ is the correct value may be verified from filter structure 40 of FIG. 4 at the third tap location.

In the second clock phase of the first clock cycle, multiplier 87 functions to provide the output signal $C(2,k)$ which is subsequently used by adder 96. The data input $X(3,k)$ is coupled from RAM 99 via multiplexor 90 to recoder 92. The error term $\beta e(k-1)$ is provided from data bus via latch 85 and multiplexor 86. Initially, multiplexor 86 is controlled by control signal C4 to provide a zero value input representing no error update. For subsequent calculations of $Y(k)$ of the LMS algorithm, circuitry not shown will provide an error term $\beta e(k-1)$ for use by multiplier 87. Recoder 92 functions to implement a predetermined recoding algorithm for use by multiplier 87. It should be understood that additional recoders may be utilized with recoder 92 to provide for a wider precision of data. In the first clock cycle, multiplier 106 does not provide an output since adder 96 has not yet provided a value for the W operand. It should be noted that in the first clock cycle that an address A of RAM 99 is addressed, and during clock cycle $\phi 1$ RAM 99 is read from. Also during the second clock phase of the first clock cycle, latch 114 is reset to zero.

In the first clock phase of the second clock cycle, RAM 99 is read to provide data input $X(2,k)$ for subsequent use by multiplier 87. The coefficient value $W(2,k-1)$ and operand $C(2,k)$ are respectively connected to the first and second inputs of adder 96 from RAM 99 and multiplier 87, respectively. Also, during the first phase of the second clock cycle, adder 110 is not operational since multiplier 106 was not operational in the first clock cycle to provide adder 110 with a T operand. The coefficient value $W(1,k-1)$ is also read from RAM 99 during the first clock phase for subsequent use by adder 96.

In the second clock phase of the second clock cycle, RAM 99 is written to for storing both the coefficient value $W(2,k)$ calculated in the first clock phase and the new data input $x(3, k+1)$. Recoder 92 is provided with the data input $X(2,k)$; recoder 92 is provided with the data input $X(2,k)$ and multiplier 106 is provided with the coefficient value $W(2,k)$. Multiplier 87 calculates $C(1,k)$, and multiplier 106 calculates $T(2,k)$. During the second clock cycle, an address B location in RAM 99 is selected in response to control signal C2.

In the first clock phase of the third clock cycle, RAM 99 is read to provide X(1,k) for subsequent use by multiplier 87 and to provide W(0,k−1). The operands W(1,k−1) and C(1,k) are respectively connected to the first and second inputs of adder 96 from RAM 99 and multiplier 87, respectively. Adder 96 calculates W(1,k) which is stored by latch 97 and in the subsequent clock phase both written to RAM 99 and coupled to multiplier 99. Concurrently, adder 110 of convolution portion 82 adds the operand T(2,k) provided in the previous clock phase by multiplier 106 with a zero operand value to provide operand Y(k). During the third clock cycle, an address C location in RAM 99 is selected in response to control signal C2.

In the second clock phase of the third clock cycle, RAM 99 is written to for storing both the coefficient operand W(1,k) calculated in the first clock phase of the third clock cycle and a new data value X(2,k). The data input X(1,k) is connected to both recoders 92 and 93, and the coefficient operand W(1,k) is connected to multiplier 106. Multiplier 87 calculates C(0,k), and multiplier 106 calculates T(2,k).

In the first clock phase of the fourth clock cycle, RAM 99 is not read. The coefficient operand W(0,k−1) previously read and C(0,k) previously calculated are respectively connected to the first and second inputs of adder 96. Also, during the first phase of the fourth clock cycle, adder 110 calculates an updated Y(k) value by adding the previous Y(k) value with T(1,k) which was calculated by multiplier 106 in the second clock phase of the third clock signal. The final value Y(k) is stored in latch 116 and in response to control signal C5 is outputted onto data bus 80. Circuitry not shown may then utilize the outputted Y(k) value and subtract this value from a predetermined correct value to calculate a new error term $\beta e(k)$ to be used in a subsequent (k+1) time frame.

In the second clock phase of the fourth clock cycle, RAM 99 is written to for storing the coefficient value W(0,k) calculated in the first clock phase. Recoder 93 is provided with the data input X(0,k), and multiplier 106 is provided with the coefficient value W(0,k). Multiplier 87 of update portion 81 does not function during the fourth clock cycle since the C operand for the lowest tap location, zero, was previously calculated. During the fourth clock cycle, address A location in RAM 99 may again be selected in response to control signal C2 to be read from and written to.

After the fourth clock cycle is completed, the operation of processor 79 is repetitive. That is, subsequent values for the Y operand, such as Y(k+1), may be calculated and the LMS algorithm implemented. Also, multiple filters may be implemented in a pipelined fashion in a single time frame where each time frame includes a plurality of clock beats, each plurality being equivalent to one of the illustrated clock cycles. By now it should be apparent that the three tap filter structure of FIG. 4 is implemented in four clock cycles by processor 79. Processor 79 is implemented so that a single RAM may be used to store both filter coefficient operands, W, and data operands, X, as opposed to using two RAMs for storing each type of operand, respectively. Also, the filter structure of FIG. 4 wherein both multiplier 56 and multiplier 64 are concurrently coupled to the same data operand means that processor 79 may be implemented so that recoders 92 and 93 may both be driven simultaneously by the same data operand from data bus 80 or RAM 99.

Another aspect of the present invention involves the pipelined operation of multiple filters implementing the LMS algorithm. Typically, others have implemented the LMS algorithm with an N tap filter by completely performing N convolution operations with one processor or integrated circuit and then performing N update operations with another processor or time division multiplexing of a single hardware circuit for doing both convolutional and updating operations. Each of the operands associated with the N update operations had to be selectively coupled to respective operands of the update operation. In contrast, in the present invention an update structure is essentially provided in a convolutional structure. In other words, an N tap filter in the present invention is implemented by performing both a convolution and an update for N calculations. This significantly shortens the processor execution time and allows a minimum amount of circuitry to be used to implement an N tap filter. Multiple filters can thus be implemented without a loss of clock cycles during transitions between independent filters. The processor structure of the present invention provides external control of the coefficient update operation by being able to control multiplexor 86 thru control signal C4. For any new data sample, external control circuitry can determine whether the coefficients of the filter are updated or not. Conventional external control circuitry can also determine the update rate by selecting the adaption beta ($\beta$) at multipliexor 86. External circuitry can also force the tap data to a known state, if desirable.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A pipelined processor for implementing a least mean squares (LMS) algorithm in an N-tap filter, where N is an integer, by calculating a convolution of a series of data values and coefficient values for the N taps and substantially concurrently performing an adaption calculation of the series of coefficient values by updating the coefficient value for each tap of the filter, comprising:

update means for performing a predetermined number of update calculations to the coefficient values required to implement the predetermined algorithm, said update calculations being performed during a predetermined time period;

convolution means coupled to the update means for summing during the same time period a predetermined number of convolution products, each formed by multiplying a predetermined coefficient value and a predetermined data value, to provide an output signal which represents said convolution; and storage means which store both data values and coefficient values in a single memory structure, said storage means being coupled to both the update means and the convolution means for selectively providing both the data values and coefficient values required by both the update means and convolution means to implement the LMS algorithm, said storage means selectively concurrently providing a same data value to each of the update means and the convolution means for multiplication.

2. The pipelined processor of claim 1 wherein said predetermined time period comprises (N+1) clock cycles of a clock signal of predetermined frequency.

3. The pipelined processor of claim 1 wherein said update means further comprise:
- a multiplier having a first input for receiving a multiplicand operand, a second input for receiving a recoded multiplier operand, and an output, said multiplier multiplying a predetermined error operand chosen for said filter and a recoded data operand to provide an updated coefficient value; and
- an adder having a first input coupled to the output of the multiplier, and a second input coupled to the storage means, said adder providing for each tap of the filter a sum of the coefficient update value and a predetermined previous coefficient provided by the storage means, thereby performing the adaption calculation.

4. The pipelined processor of claim 1 wherein said convolution means further comprise:
- a multiplier having a first input for receiving a multiplicand operand, a second input for receiving a recoded multiplier operand, and an output, said multiplier multiplying a predetermined updated coefficient value and a recoded data operand for each tap of the filter to provide a convolution term; and
- an adder having a first input coupled to the output of the multiplier, and a second input coupled to an output thereof, said adder performing N accumulations to implement the convolution of the series of data values and coefficient values for the N taps of the filter.

5. A pipelined processor for implementing a least mean squares (LMS) algorithm in an N-tap filter, where N is an integer, by calculating a convolution of a series of data values and coefficient values for the N taps and substantially concurrently performing an adaption calculation of the series of coefficient values by updating the coefficient value for each tap of the filter, comprising:
- update means comprising a first recoded multiplier for performing a predetermined number of update calculations to the coefficient values required to implement the LMS algorithm, said update calculations being performed during a predetermined time period;
- convolution means comprising a second recoded multiplier, said convolution means coupled to the update means for summing a predetermined number of convolution products during the same time period, each formed by multiplying a predetermined coefficient value and a predetermined data value, to provide an output signal which represents said convolution; and
- storage means coupled to both the update means and the convolution means for selectively providing both the data values and coefficient values required by both the update means and convolution means to implement the least mean squares algorithm, wherein said storage means selectively concurrently provides a same data value to each recoded multiplier of the update means and convolution means.

6. A method of implementing a predetermined algorithm in a pipelined processor which performs an N-tap filter function, N being an integer, by calculating a convolution of a series of data values and coefficient values for the N taps and substantially concurrently performing an adaption calculation of the series of coefficient values by updating the coefficient value for each tap of the filter, comprising the steps of:
- time multiplexing an update circuit means of the processor to perform a predetermined number of update calculations during a predetermined time frame;
- time multiplexing a convolution circuit means to perform a predetermined number of convolution products during the same time period, a final convolution product representing a completed calculation of the predetermined algorithm; and
- coupling a single storage means to both the update circuit means and the convolution circuit means to provide the data values and coefficient values required by both the update circuit means and the convolution circuit means to implement the predetermined algorithm.

7. The method of claim 6 further comprising the step of:
- utilizing a clock signal of predetermined frequency to define said predetermined time frame, said predetermined algorithm requiring (N+1) cycles of the clock signal to calculate N update and convolution products per time frame.

8. A pipelined filter structure which implements a least mean squares (LMS) algorithm for N taps, where N is an integer, said filter structure calculating a convolution of a series of data values and coefficient values for the N taps and substantially concurrently during a predetermined time period performs an adaption calculation of the series of coefficient values by updating the coefficient value for each tap of the filter, comprising:
- a first multiplier having a first input for receiving a multiplicand operand representing a data value from an immediately previous time period, a second input, and an output which provides an updated coefficient value;
- a storage means having an input coupled to the output of the first multiplier for receiving the updated coefficient value, and first and second outputs;
- a first recoder having an input coupled to the first output of the storage means, and an output coupled to the second input of the first multiplier, for receiving data values for each tap of the filter from the storage means and recoding said data values in accordance with a predetermined recoding algorithm to improve speed of operation of the first multiplier;
- a first adder having a first input coupled to the output of the first multiplier, a second input coupled to the second output of the storage means, and an output for providing for each tap of the filter a coefficient sum of the updated coefficient value and a predetermined previous coefficient;
- a second recoder having an input coupled to the first output of the storage means for receiving a same data value received by the first recoder, and an output for providing a recoded data operand;
- a second multiplier having a first input coupled to the output of the first adder for receiving the coefficient sum, a second input coupled to the output of the second recoder, and an output which provides a convolution term in response to multiplying the coefficient sum and the recoded data operand; and a second adder having a first input coupled to the output of the second multiplier, and a second input coupled to an output thereof, said second adder performing N accumulations to implement the convolution of the series of data values and coefficient values for the N taps of the filter.

* * * * *